US009905807B2

(12) United States Patent
Lee

(10) Patent No.: US 9,905,807 B2
(45) Date of Patent: Feb. 27, 2018

(54) ORGANIC LIGHT EMITTING DIODE

(71) Applicant: Samsung Display Co., Ltd., Yongin-si (KR)

(72) Inventor: Hyunshik Lee, Incheon (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/850,592

(22) Filed: Sep. 10, 2015

(65) Prior Publication Data

US 2016/0204385 A1     Jul. 14, 2016

(30) Foreign Application Priority Data

Jan. 13, 2015   (KR) .................. 10-2015-0006149

(51) Int. Cl.
H01L 51/52       (2006.01)
H01L 51/56       (2006.01)

(52) U.S. Cl.
CPC ...... H01L 51/5275 (2013.01); H01L 51/5265 (2013.01); H01L 51/56 (2013.01)

(58) Field of Classification Search
CPC ...... H01L 51/50; H01L 51/56; H01L 51/5275
See application file for complete search history.

(56) References Cited

U.S. PATENT DOCUMENTS

| 6,206,065 B1 | 3/2001 | Robbie et al. | |
| 2009/0147196 A1* | 6/2009 | Horie | C08J 7/047 349/122 |
| 2010/0136233 A1* | 6/2010 | Little | C23C 14/562 427/248.1 |
| 2013/0044282 A1* | 2/2013 | Kuwabara | G02F 1/1333 349/96 |
| 2014/0183493 A1* | 7/2014 | Lee | H01L 51/56 257/40 |

FOREIGN PATENT DOCUMENTS

| KR | 1020010076277 | 8/2001 |
| KR | 100424519 | 3/2004 |
| KR | 1020110059304 | 6/2011 |
| KR | 1020130061277 | 6/2013 |
| KR | 1020140060173 | 5/2014 |

OTHER PUBLICATIONS

Yong Jun Park et al., "Antireflection Coatings with Helical SiO2 Films Prepared Using Glancing Angle Deposition", Journal of the Korean Physical Society, pp. 2634-2637, vol. 55, No. 6, Incheon, Republic of Korea 402-751 (Sep. 28, 2009).

* cited by examiner

Primary Examiner — Lex Malsawma
Assistant Examiner — Xia Cross
(74) Attorney, Agent, or Firm — H.C. Park & Associates, PLC

(57) ABSTRACT

An organic light emitting diode includes: a first electrode; a hole transport region disposed on the first electrode; an emitting layer disposed on the hole transport region, the emitting layer configured to emit light; an electron transport region disposed on the emitting layer; a second electrode disposed on the electron transport region; a capping layer disposed on the second electrode; and a compensation layer disposed on the capping layer, the compensation layer including a compensation pattern, wherein the compensation pattern is configured to compensate a phase of an inclined light, and wherein the inclined light is a light emitted from the emitting layer.

16 Claims, 4 Drawing Sheets

ORGANIC LIGHT EMITTING DIODE

CROSS-REFERENCE TO RELATED APPLICATIONS

This application claims priority from and the benefit of Korean Patent Application No. 10-2015-0006149, filed on Jan. 13, 2015, which is hereby incorporated by reference for all purposes as if fully set forth herein.

BACKGROUND

Field

Exemplary embodiments relate to an organic light emitting diode and to a method of manufacturing the same.

Discussion of the Background

Flat panel display devices can be generally divided into a light emitting type and a light receiving type. The light emitting type flat panel display device includes a flat cathode ray tube, a plasma display panel, an organic light emitting display, and the like. The organic light emitting display, that is a self-light emitting type display, may have a wide viewing angle, an excellent contrast, and a fast response rate.

Accordingly, the organic light emitting display may be applied to a display device for a mobile device such as a digital camera, a video camera, a camcorder, a personal digital assistant, a smart phone, an ultra-thin notebook, a tablet personal computer, a flexible display device, and the like, or a large electronic product such as an ultra-thin television and the like.

An organic light emitting diode (OLED) included in the organic light emitting display may produce colors by injecting a hole and an electron respectively from a first electrode and a second electrode, recombining the hole and the electron in an emitting layer to generate an exciton, and emitting light from a transition of the generated exciton from an excited state to a ground state.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting diode with improved visibility by reducing white angular dependency (WAD).

Additional aspects will be set forth in the detailed description which follows, and, in part, will be apparent from the disclosure, or may be learned by practice of the inventive concept.

According to one or more exemplary embodiments, an organic light emitting diode includes: a first electrode; a hole transport region disposed on the first electrode; an emitting layer disposed on the hole transport region, the emitting layer configured to emit light; an electron transport region disposed on the emitting layer; a second electrode disposed on the electron transport region; a capping layer disposed on the second electrode; and a compensation layer disposed on the capping layer, the compensation layer including a compensation pattern, wherein the compensation pattern is configured to compensate a phase of an inclined light, and wherein the inclined light is a light emitted from the emitting layer.

According to one or more exemplary embodiments, a display device includes a plurality of pixels, wherein at least one of the pixels includes: a first electrode; a hole transport region disposed on the first electrode; an emitting layer disposed on the hole transport region, the emitting layer configured to emit light; an electron transport region disposed on the emitting layer; a second electrode disposed on the electron transport region; a capping layer disposed on the second electrode; and a compensation layer disposed on the capping layer, the compensation layer including a compensation pattern configured to compensate for a phase of an inclined light, wherein the inclined light is a light emitted from the emitting layer.

According to one or more exemplary embodiments, a method of manufacturing a compensation layer on the capping layer using glancing angle deposition includes: disposing a source including a deposition material, wherein the deposition material is configured to be deposited toward a deposition direction; disposing a substrate facing the source inclined at the inclination angle with respect to the deposition direction; and forming the compensation layer by heating the deposition material using an electron beam in a high vacuum state to deposit a thin film onto the substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
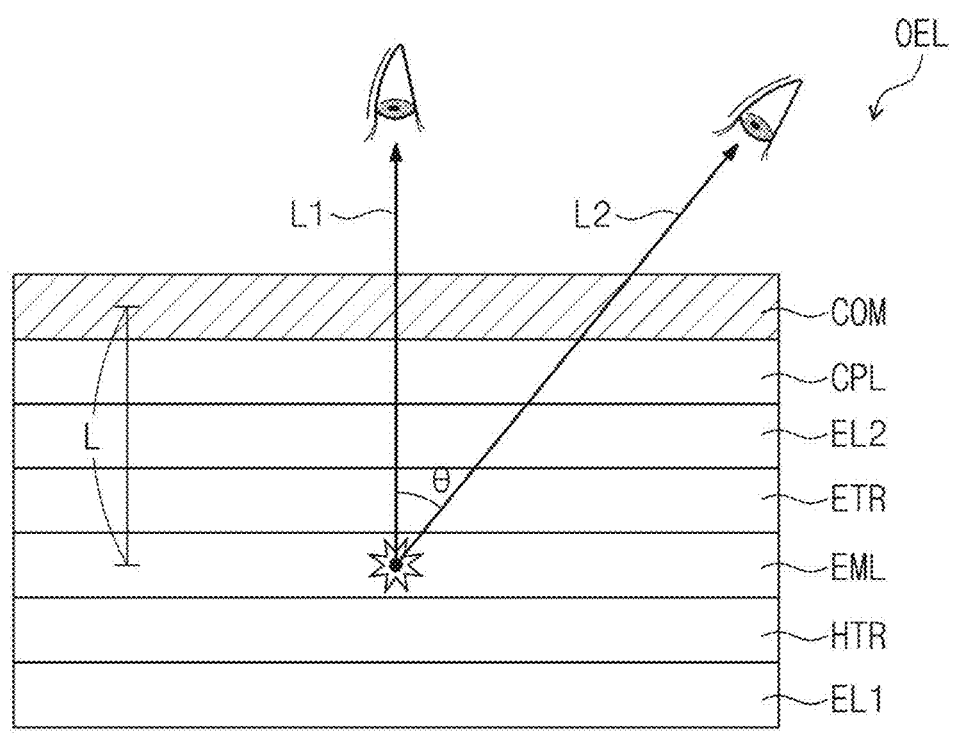
FIG. 1 is a cross-sectional view of an organic light emitting diode, according to one or more exemplary embodiments.
Figure 1:
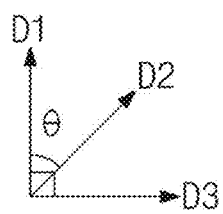

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described in detail with reference to the accompanying drawings.

FIG. 1 is a cross-sectional view of an organic light emitting diode, according to one or more exemplary embodiments. Referring to FIG. 1, an organic light emitting diode OEL includes first electrode EL1, hole transport region HTR, emitting layer EML, electron transport region ETR, second electrode EL2, capping layer CPL, and compensation layer COM.

The first electrode EU may be a pixel electrode and/or an anode. The first electrode EL1 may be a transmissive electrode, a semi-transmissive electrode, and/or a reflective electrode. The first electrode EL1 formed of a transmissive electrode may be formed of a transparent metal oxide including at least one of indium tin oxide (ITO), indium zinc oxide (IZO), zinc oxide (ZnO), and indium tin zinc oxide (ITZO). The first electrode EL1 formed of a semi-transmissive electrode and/or a reflective electrode may include at least one of Ag, Mg, Al, Pt, Pd, Au, Ni, Nd, Ir, Cr, and a mixture thereof.

The first electrode EL1 may have a single-layer structure or a multi-layer structure, each layer being formed of a transparent metal oxide and/or a metal. For example, the first electrode EL1 may have a single-layer structure formed of ITO, Ag, or a metal mixture (e.g., a mixture of Ag and Mg), a two-layer structure of ITO/Mg or ITO/MgF, or a three-layer structure of ITO/Ag/ITO. The exemplary embodiments, however, are not limited thereto.

An organic layer may be disposed on the first electrode EL1. The organic layer includes the emitting layer EML. The organic layer may further include the hole transport region HTR and the electron transport region ETR.

The hole transport region HTR may include at least one of a hole injection layer, the hole transport layer, a buffer layer and an electron blocking layer.

The hole transporting region HTR may be a single-layer made of a single material, or a single-layer made of a plurality of materials different form each other, or may have a multi-layer structure having a plurality of layers of a plurality of materials different from each other. For example, the hole transport region HTR may have a single-layer structure including a plurality of different materials, or a multi-layer structure including at least one of the following structures sequentially stacked: hole injection layer/hole transport layer, hole injection layer/hole transport layer/ buffer layer, hole injection layer/buffer layer, hole transport layer/buffer layer, and hole injection layer/hole transport layer/electron blocking layer. However, the exemplary embodiments are not limited thereto.

The hole transport region HTR may be formed by using various methods including, but not limited to, vacuum deposition, spin coating, casting, a Langmuir-Blodgett method, an inkjet printing method, a laser printing method, and a laser induced thermal imaging (LITI) method.

When the hole transport region HTR includes the hole injection layer, the hole transport region HTR may include, but is not limited to, at least one of a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4',4"-Tris(N,N-diphenylamino)triphenylamine (TDATA), 4,4',4"-tris{N,-(2-naphthyl)-N-phenylamino}-triphenylamine (2TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), and (Polyaniline)/Poly(4-styrenesulfonate) (PANI/PSS).

When the hole transport region HTR includes a hole transport layer, the hole transport region HTR may include, but is not limited to, at least one of a carbazole derivative (such as N-phenyl carbazole and polyvinyl carbazole), a fluorine derivative, a triphenylamine derivative (such as N,N'-bis(3-methylphenyl)-N,N'-diphenyl-[1,1-biphenyl]-4,4'-diamine (TPD), 4,4',4"-tris(N-carbazolyl)triphenylamine (TCTA)), N,N'-di(1-naphthyl)-N,N'-diphenylbenzidine (NPB), and 4,4'-Cyclohexylidene bis[N,N-bis(4-methylphenyl)benzenamine] (TAPC).

The hole transport region HTR may have a thickness ranging from about 100 Å to about 10000 Å, for example, from about 100 Å to about 1000 Å. When the hole transport region HTR includes both the hole injection layer and the hole transport layer, the hole injection layer may have a thickness ranging from about 100 Å to about 10000 Å, for example, from about 100 Å to about 1000 Å, and the hole transport layer may have a thickness ranging from about 50 Å to about 2000 Å, for example, from about 100 Å to about 1500 Å. The hole transport layer HTR, the hole injection layer, and hole transport layer having thicknesses respectively satisfying the above mentioned ranges, may have an improved hole transport property without a substantial rise in driving voltage.

The hole transport region HTR may further include a charge generating material to improve the conductivity thereof. The charge generating material may be uniformly or non-uniformly dispersed within the hole transport region HTR. The charge generating material may be, for example, a p-dopant material. The p-dopant material may include, but is not limited to, at least one of a quinine derivative, a metal oxide, and a cyano group-containing compound. For example, the p-dopant material may include, but is not limited to, a quinone derivative (such as tetracyanoquinodimethane (TCNQ) and/or 2,3,5,6-tetrafluoro-tetracyanoquinodimethane (F4-TCNQ)) and a metal oxide (such as tungsten oxide and/or molybdenum oxide).

As previously mentioned, the hole transport region HTR may further include at least one of a buffer layer and an electron blocking layer in addition to the hole injection layer and the hole transport layer. The buffer layer may enhance light emitting efficiency by compensating for a resonance distance according to a wavelength of light emitted from the emitting layer. The buffer layer may be formed of a material which may be included in the hole transport region HTR. The electron blocking layer may reduce or prevent an electron from being injected into the hole transporting region HTR from the electron transporting region ETR.

The emitting layer EML is disposed on the hole transport region HTR. The emitting layer EML may be a single-layer made of a single material, or a single-layer made of a plurality of materials different form each other, or may have a multi-layer structure having a plurality of layers made of a plurality of materials different from each other.

The emitting layer EML may be formed by using various methods including, but not limited to, spin coating, casting, a Langmuir-Blodgett method, an inkjet printing method, a laser printing method, and a laser induced thermal imaging (LITI) method.

For example, the emitting layer EML may be formed of, but is not limited to, a material emitting at least one of red, green, and blue light, and may include a fluorescent material and/or a phosphorescent material. Further, the emitting layer EML may include a host material and/or a dopant material.

The host material may include a typically available material, for example, but is not limited to, tris(8-hydroxyquinolinato)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-Methyl-9,10-bis(naphthalen-2-yl)anthracene (MADN) and the like.

The emitting layer EML configured to emit red light may include, for example, a fluorescent material including PBD: Eu(DBM)3(Phen)(tris(dibenzoylmethane)phenanthroline europium) and/or perylene. When the emitting layer EML emits red light, the dopant material included in the emitting layer EML may include a metal complex and/or an organometallic complex such as acac(bis(1-phenylisoquinoline) acetylacetonate iridium (PIQIr), acac(bis(1-phenylquinoline)acetylacetonate iridium (PQIr), tris(1-phenylquinoline) iridium (PQIr), and octaethylporphyrin platinum (PtOEP).

The emitting layer EML configured to emit green light may include, for example, a fluorescent material including tris(8-hydroxyquinolino)aluminum (Alq3). When the emitting layer EML emits green light, the dopant material included in the emitting layer EML may include a metal complex and/or an organometallic complex such as Ir(ppy)3(fac-tris(2-phenylpyridine)iridium).

The emitting layer EML configured to emit blue light may include, for example, a fluorescent material including at least one of spiro-DPVBi, spiro-6P, distyryl-benzene (DSB), distyryl-arylene (DSA), Polyfluorene (PFO) polymers, and poly(p-phenylene vinylene (PPV) polymers. When the emitting layer EML emits blue light, the dopant material included in the emitting layer EML may include a metal complex and/or an organometallic complex such as (4,6-F2ppy)2Irpic.

The electron transport region ETR may be disposed on the emitting layer EML. The electron transport region ETR may include, but is not limited to, at least one of the hole blocking layer, the electron transport layer ETL, and the electron injection layer. For example, the electron transport region ETR may have, but is not limited to, at least one of the following structures sequentially stacked: electron transport layer/electron injection layer and hole blocking layer/electron transport layer/electron injection layer, or a single-layer structure including two or more layers of the above layers. However, the exemplary embodiments are not limited thereto.

The electron transport region ETR may be formed by using various methods including, but not limited to, vacuum deposition, spin coating, casting, a Langmuir-Blodgett method, an inkjet printing method, a laser printing method, and a laser induced thermal imaging (LITI) method.

When the electron transport region ETR includes the electron transport layer, the electron transport region ETR may include, but is not limited to, at least one of Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato) aluminum (BAlq), berylliumbis(benzoquinolin-10-olate) (Bebq2), 9,10-di(naphthalene-2-yl)anthracene (ADN), and a mixture thereof.

The electron transport layer may have a thickness ranging from about 100 Å to about 1000 Å, for example, from about 150 Å to about 500 Å. The electron transport layer having thickness satisfying the above mentioned range may have an improved electron transport property without a substantial rise in driving voltage.

When the electron transport region ETR includes the electron injection layer, the electron transport region ETR may use, but is not limited to, at least one of LiF, Lithium quinolate (LiQ), $Li_2O$, BaO, NaCl, CsF, a lanthanide metal such as Yb, and a metal halide such as RbCl and RbI.

The electron injection layer may further include at least one of an electron transport material and an insulating organo metal salt. The organo metal salt may include a material having an energy band gap of about 4 eV or higher. For example, the organic metal salt may include at least one of metal acetate, metal benzoate, metal acetoacetate, metal acetylacetonate, and metal stearate.

The electron injection layer may have a thickness ranging from about 1 Å to about 100 Å, for example, from about 3 Å to about 90 Å. The electron injection layer having thickness satisfying the above mentioned range may have an improved electron injection property without a substantial rise in driving voltage.

The electron transport region ETR may include the hole blocking layer. The hole blocking layer may include, but is not limited to, for example, at least one of 2,9-dimethyl-4,7-diphenyl-1,10-phenanthroline (BCP) and 4,7-diphenyl-1,10-phenanthroline (Bphen).

The hole blocking layer may have a thickness ranging from about 20 Å to about 1000 Å, for example, from about 30 Å to about 300 Å. The hole blocking layer having thickness satisfying the above mentioned range may have an improved hole-blocking property without a substantial rise in driving voltage.

The second electrode EL2 may be disposed on the electron transport region ETR. The second electrode EL2 may be a common electrode and/or a cathode. The second electrode EL2 may be formed of a transmissive electrode, a semi-transmissive electrode, and/or a reflective electrode. When the second electrode EL2 is formed of a transmissive electrode, the second electrode EL2 may include at least one of Li, Ca, LiF/Ca, LiF/Al, Al, Mg, BaF, Ba, Ag, a compound thereof, and a mixture thereof (e.g., a mixture of Ag and Mg).

The second electrode EL2 may include an auxiliary electrode. The auxiliary electrode may include a film formed by depositing one of the foregoing materials facing the emitting layer, a transparent metal oxide film disposed on the film, such as indium tin oxide (ITO), indium zinc oxide (IZO), zinc oxide (ZnO), and indium tin zinc oxide (ITZO), Mo, and Ti.

When the second electrode EL2 is a semi-transmissive electrode or a reflective electrode, the second electrode EL2 may include Ag, Mg, Al, Pt, Pd, Au, Ni, Nd, Ir, Cr, Li, Ca, LiF/Ca, LiF/Al, Mo, Ti, a compound thereof, and a mixture thereof (e.g., a mixture of Ag and Mg). The second electrode EL2 may have a multi-layer structure including a reflective film or semi-transmissive film formed of the above materials, and a transparent conductive film including at least one of indium tin oxide (ITO), indium zinc oxide (IZO), zinc oxide (ZnO), indium tin zinc oxide (ITZO) and the like.

According to the exemplary embodiments, the organic light emitting diode OEL may be a top emission type organic light emitting diode. In this case, the first electrode EL1 may be a transmissive electrode, and the second electrode EL2 may be a semi-transmissive electrode or a reflective electrode.

As voltages are respectively applied to the first electrode EL1 and the second electrode EL2, holes injected from the first electrode EL1 may move into the emitting layer EML through the hole transport region HTR, and electrons injected from the second electrode EL2 may move into the emitting layer EML through the electron transport region ETR. The electrons and the hole are recombined in the emitting layer EML to generate excitons, and the excitons transit from an excited state to a ground state to emit light.

Capping layer CPL may be disposed on the second electrode EL2. The capping layer CPL may reflect at least a portion of light emitted from the emitting layer EML from an upper surface of the capping layer CPL toward the emitting layer EML. The reflected light may be amplified inside the organic layer by a resonance effect, and the display device may have an improved luminescent efficiency.

The capping layer CPL may have a refractive index of about 1.9 to about 2.4. When the refractive index of the emitting layer EML is less than about 1.9, the light emitted from the emitting layer EML may not be sufficiently reflected from the upper surface of the capping layer CPL toward the emitting layer EML, and amplification of the reflected light inside the organic layer by a resonance effect may be reduced. When a refractive index of the capping layer CPL is more than about 2.4, the light emitted from the emitting layer EML may be excessively reflected from the upper surface of the capping layer CPL toward the emitting layer EML, excessively reducing the light passing through the capping layer CPL, and the light displaying an image may be reduced.

To improve luminescent efficiency, an internal resonator structure may be formed inside the organic light emitting diode OEL. According to the internal resonator structure, a light seen from a direct front side of the organic light-emitting diode OEL and a light seen from side of the organic light emitting diode OEL may have varied light paths in the internal resonant structure, and therefore, a white angular dependency (WAD) may occur when the organic light emitting diode OEL is seen from an angle between the front and a side. Accordingly, to reduce or prevent the WAD, the organic light emitting diode OEL according to exemplary embodiments may include the compensation layer COM compensating for a phase difference between front light L1 and inclined light L2.

The compensation layer COM may be disposed on the capping layer CPL. To reduce or prevent a WAD phenomenon caused by the phase difference between the front light L1 and the inclined light L2, the compensation layer COM may compensate for the phase of the inclined light L2. Herein, the front light L1 represents light passing through the compensation layer COM in a first direction D1, that is perpendicular to a surface of the compensation layer COM, and the inclined light L2 represents light passing through the compensation layer COM in a second direction D2, that is inclined with reference to the first direction D1. An angle between the first and second directions may be greater than about 0 degrees and smaller than about 90 degrees.

A compensation pattern (not shown), for compensating for the phase of the inclined light L2, may be disposed on the compensation layer COM. The compensation layer COM may have a different refractive index according to a direction by the compensation pattern, and the phase of the inclined light L2 passing through the compensation layer COM in the second direction D2 may be compensated.

In more detail, light emitted to outside through the compensation layer COM may satisfy the following Equation 1:

$$\Phi = \beta \cdot L \cdot \cos\theta = \frac{2\pi \cdot n_{eff}}{\lambda} \cdot L \cdot \cos\theta \qquad \text{[Equation 1]}$$

where $\Phi$ represents a phase of the emitted light, $\beta$ represents a propagation constant of a medium, L represents the distance L from the emitting layer EML to the compensation layer COM, $\lambda$ represents a wavelength of the emitted light, $\theta$ represents an angle which the front light L1 and the emitted light forms, and $n_{eff}$ represents an effective refractive index of the medium.

According to Equation 1, the phase of the emitted light may be reduced as the angle $\theta$ between the front light L1 and the emitted light increases. Here, $\theta$ may be greater than about 0 degrees and smaller than about 90 degrees. Accordingly, the phase of the inclined light L2 may be smaller than the phase of the front light L1, and a WAD phenomenon may occur due to phase difference between the front light L1 and the inclined light L2.

Therefore, to reduce the phase difference between the front light L1 and the inclined light L2, the phase of the inclined light L2 may be compensated by using the effective refractive index of Equation 1. The effective refractive index of Equation 1 may satisfy Equation 2 below.

$$\frac{1}{n_{eff}^2} = \frac{\cos^2\theta}{n_o^2} + \frac{\sin^2\theta}{n_e^2} \qquad \text{[Equation 2]}$$

where $n_e$ represents a refractive index in a vertical direction D1 within the medium (hereinafter referred to as "first refractive index") and $n_o$ represents a refractive index in a horizontal direction D3 within the medium (hereinafter referred to as "second refractive index"). More specifically, the first refractive index $n_e$ represents a refractive index in a direction D1 which is perpendicular to a surface of the compensation layer COM, and the second refractive index $n_o$ represents a refractive index in a horizontal direction D3 parallel to the surface of the compensation layer COM.

According to the Equation 2, the effective refractive index may be changed in response to the first refractive index $n_e$ and the second refractive index $n_o$. In particular, the effective refractive index may be increased when the first refractive index $n_e$ is greater than the second refraction index $n_o$.

Therefore, the organic light emitting diode OEL according to may include the compensation layer COM having the first refractive index $n_e$ in the vertical direction D1 is greater than the second refractive index $n_o$ in the horizontal direction D3. Thus, as an angle which the front light L1 and the emitted light L2 form increases, the shortened effective length (cos $\theta$) may be compensated by increasing the effective refractive index $n_{eff}$. As a result, the phase difference between the front light L1 and the inclined light L2 may be reduced or minimized, reducing the WAD phenomenon. This may be confirmed by Equation 3 which is derived from substituting Equation 2 into Equation 1.

$$\Phi = \frac{2\pi}{\lambda} \cdot \frac{no \cdot ne}{\sqrt{ne^2(\cos\theta)^2 + no^2(\sin\theta)^2}} \cdot L \cdot \cos\theta \qquad \text{[Equation 3]}$$

For this, an exemplary embodiment of the compensation layer COM may includes the compensation pattern. The compensation pattern may form the first refractive index $n_e$ of the compensation layer COM greater than the second refractive index $n_o$ of the compensation layer COM. The compensation pattern may be formed on the compensation layer COM by glancing angle deposition and may have a zigzag pattern, a wave pattern, or an inclined pattern. Detailed description of the compensation pattern will be described below in detail with respect to FIGS. 2A, 2B, 2C, and 3.

Figure 2A:
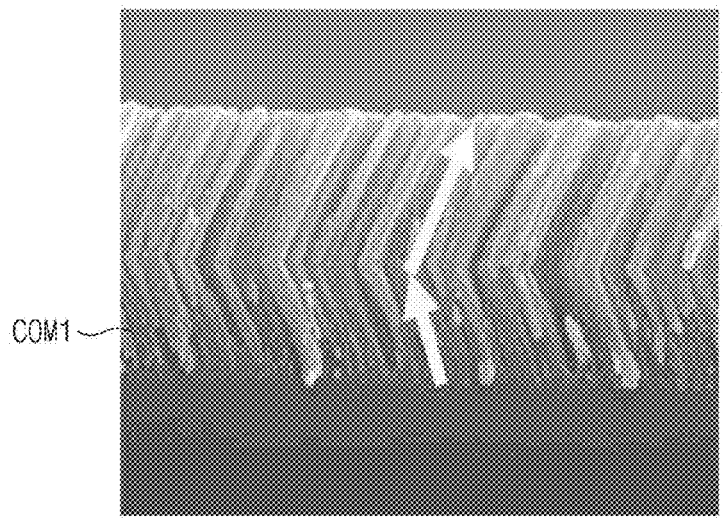
FIGS. 2A, 2B, and 2C are sectional diagrams of compensation layers including compensation patterns, according to one or more exemplary embodiments.
Figure 2B:
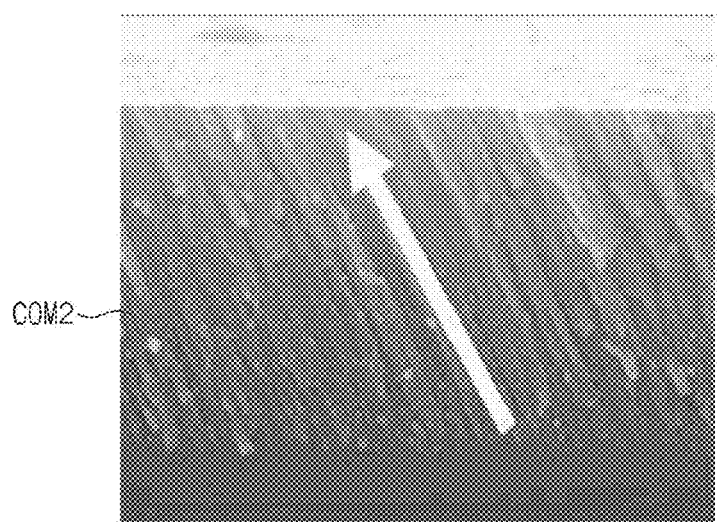
Figure 2C:
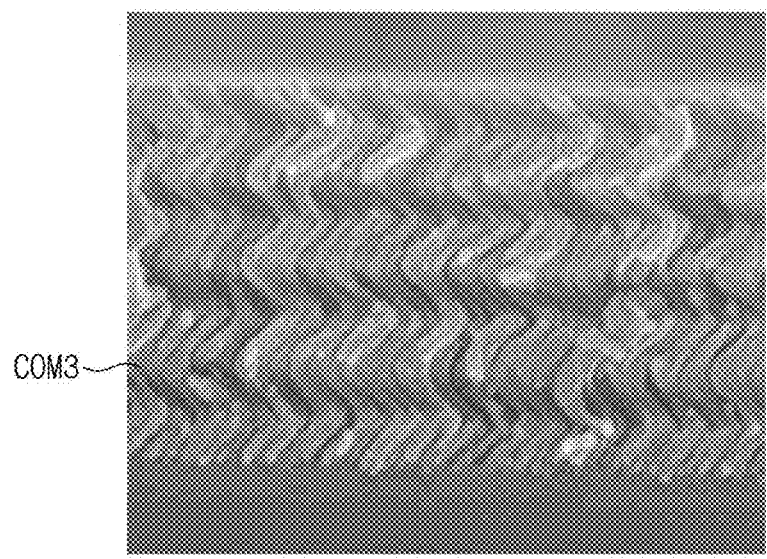

FIGS. 2A, 2B, and 2C are cross-sectional diagrams of the compensation layer including the compensation pattern, according to one or more exemplary embodiments.

Referring to FIGS. 2A, 2B, and 2C, various compensation patterns may be formed on the compensation layer COM. Each of the compensation patterns may compensate for the phase of inclined light L2 by having the first refractive index $n_e$ greater than the second refractive index $n_o$. A compensation pattern may be formed on the compensation layer COM in various shapes.

Referring to FIG. 2A, a compensation layer COM1 may have a zigzag pattern as a compensation pattern. The zigzag pattern may represent a compensation pattern in which a straight line is bent to have a 'Z' shape.

Referring to FIG. 2B, a compensation layer COM2 may have an inclined pattern as a compensation pattern. The inclined pattern may represent a compensation pattern in a linear shape extending in an inclined direction.

Referring to FIG. 2C, a compensation layer COM3 may have a wave pattern as a compensation pattern. The wave pattern may represent a compensation pattern in an 'S' shape in which a curved line is bent to left and right.

Figure 3:
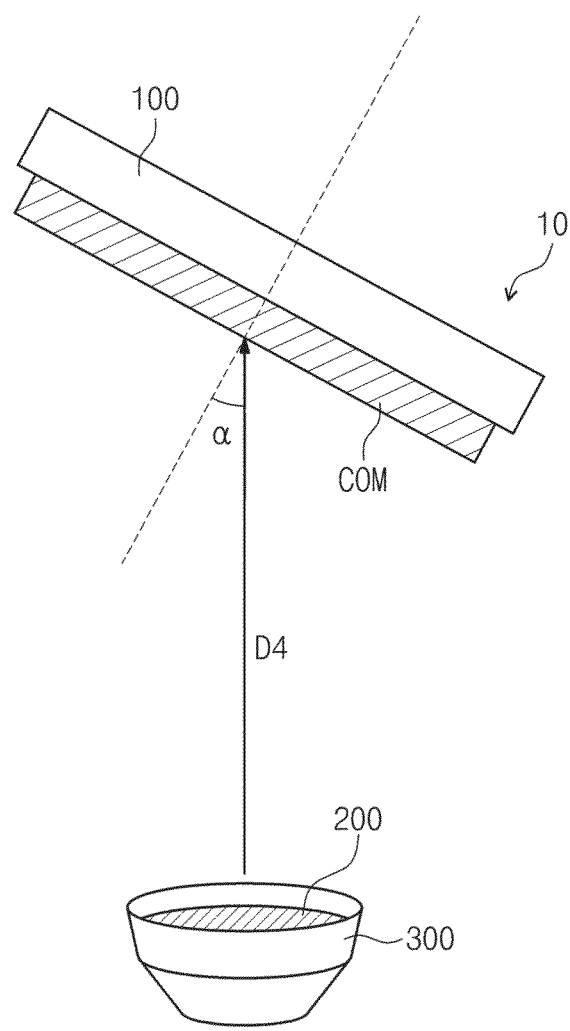
FIG. 3 is a conceptual diagram illustrating a glancing angle deposition apparatus, according to one or more exemplary embodiments.

FIG. 3 is a conceptual diagram illustrating a glancing angle deposition apparatus, according to one or more exemplary embodiments. The above-described various compensation patterns may be formed on the compensation layer COM by a glancing angle deposition apparatus.

Referring to FIG. 3, a glancing angle deposition apparatus 10 may generally include: a source 300 including a deposition material 200, and a substrate 100 on which the deposition material 200 is deposited. The source may deposit the deposition material 200 in a deposition direction D4. The compensation layer COM may be formed by depositing the deposition material 200 of the source 300 onto the substrate 100.

The substrate 100 may be formed of glass and/or a polymer material, and may be rotated while inclined at an inclination angle $\alpha$ with reference to the deposition direction D4.

The compensation pattern of the compensation layer COM is formed as the deposition material 200 is deposited onto the substrate 100, which may be inclined at the inclination angle α with reference to the deposition direction D4 or may be rotating. The inclination angle α may be changed from about 0 degrees to about 90 degrees.

The zigzag pattern shown in FIG. 2A may be deposited by periodically inclining the substrate 100 at the inclination angle from −α to α with respect to the source 300. The inclined pattern shown in FIG. 2B may be deposited by inclining the substrate 100 at the inclination angle of α. The wave pattern shown in FIG. 2C may be formed by rotating the substrate 100 in a horizontal direction with the substrate inclined at the inclination angle of α.

The compensation pattern may be formed to have a various shapes by controlling the inclination angle α of the substrate 100, a rotation direction, rotation speed, etc., but the exemplary embodiments are not limited thereto.

The deposition material 200 for forming the compensation pattern may include an inorganic insulation material including at least one of silicon-based oxide (SiOx), silicon oxynitride (SiON), and silicon-based nitride (SiON or SiNx).

The glancing angle deposition apparatus 10 may be a physical vapor deposition apparatus which heats a material to deposit a thin film by using an electron beam in a high vacuum state, including a modified structure that the substrate 100 is inclined at the inclination angle α.

A display device may include the organic light emitting diode OEL including the compensation layer. More specifically, the display device including a plurality of pixels may include at least one pixel among the plurality of pixels including the organic light emitting diode OEL of the exemplary specification. Accordingly, the display device including the organic light emitting diode OEL of the exemplary embodiments may reduce or minimize the WAD phenomenon.

According to an organic light emitting diode of one or more exemplary embodiments, white angular dependency (WAD) may be reduced, and the organic light emitting diode may have improved visibility, and improved color reproducibility.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode, comprising:
a first electrode;
a hole transport region disposed on the first electrode;
an emitting layer disposed on the hole transport region, the emitting layer configured to emit light;
an electron transport region disposed on the emitting layer;
a second electrode disposed on the electron transport region;
a capping layer disposed on the second electrode; and
a compensation layer disposed on the capping layer and disposed at the top of the organic light emitting diode,
wherein the compensation layer comprises a compensation pattern, and the compensation layer is a single layer having a uniform height when viewed in cross section,
wherein the compensation pattern is selected from a group consisting of a zigzag pattern and a wave pattern,
wherein the compensation pattern is defined inside the compensation layer,
wherein the compensation pattern is configured to compensate a phase of an inclined light, and
wherein the inclined light is a light emitted from the emitting layer.

2. The organic light emitting diode of claim 1, wherein the inclined light is configured to pass through the compensation layer in a second direction that is inclined to a first direction that is perpendicular to a surface of the compensation layer.

3. The organic light emitting diode of claim 2, wherein an angle between the first direction and the second direction is greater than 0 degrees and smaller than 90 degrees.

4. The organic light emitting diode of claim 2, wherein the compensation pattern of the compensation layer is configured to provide a first refractive index in the first direction and a second refractive index in a third direction that is a vertical direction to the first direction, and
wherein the first and second refractive indexes are different from each other.

5. The organic light emitting diode of claim 4, wherein the first refractive index is greater than the second refractive index.

6. The organic light emitting diode of claim 5, wherein the phase of the inclined light is represented by an Equation:

$$\Phi = \frac{2\pi}{\lambda} \cdot \frac{no \cdot ne}{\sqrt{ne^2(\cos\theta)^2 + no^2(\sin\theta)^2}} \cdot L \cdot \cos\theta,$$

wherein Φ is a phase of the inclined light, λ is a wavelength of the inclined light, θ is an angle formed by the first and second directions, L is a distance from the emitting layer to the compensation layer, ne is the first refractive index, and no is the second refractive index.

7. The organic light emitting diode of claim 1, wherein the compensation pattern is formed by glancing angle deposition.

8. The organic light emitting diode of claim 1, wherein the compensation layer comprises a material selected from a group consisting of silicon-based oxide ($SiO_x$), silicon oxynitride (SiON), and silicon-based nitride (SiON or $SiN_x$).

9. A display device comprising a plurality of pixels, wherein at least one of the pixels comprises:
a first electrode;
a hole transport region disposed on the first electrode;
an emitting layer disposed on the hole transport region, the emitting layer configured to emit light;
an electron transport region disposed on the emitting layer;
a second electrode disposed on the electron transport region;
a capping layer disposed on the second electrode; and
a compensation layer disposed on the capping layer and disposed at the top of the at least one pixel,
wherein the compensation layer comprises a compensation pattern configured to compensate for a phase of an inclined light, and the compensation layer is a single layer having a uniform height when viewed in cross section,
wherein the compensation pattern is selected from a group consisting of a zigzag pattern and a wave pattern,
wherein the compensation pattern is defined inside the compensation layer, and
wherein the inclined light is a light emitted from the emitting layer.

10. The display device of claim 9, wherein the inclined light is configured to pass through the compensation layer in a second direction that is inclined to a first direction that is perpendicular to a surface of the compensation layer.

11. The display device of claim 10, wherein an angle between the first direction and the second direction is greater than 0 degrees and smaller than 90 degrees.

12. The display device of claim 10, wherein the compensation pattern of the compensation layer is configured to provide a first refractive index in the first direction, and a second refractive index in a third direction that is a vertical direction to the first direction, and wherein the first and second refractive indexes are different from each other.

13. The display device of claim 12, wherein the first refractive index is greater than the second refractive index.

14. The display device of claim 13, wherein the phase of the inclined light is represented by an Equation:

$$\Phi = \frac{2\pi}{\lambda} \cdot \frac{no \cdot ne}{\sqrt{ne^2(\cos\theta)^2 + no^2(\sin\theta)^2}} \cdot L \cdot \cos\theta,$$

wherein $\Phi$ is a phase of inclined light, $\lambda$ is a wavelength of the inclined light, $\theta$ is an angle formed by the first and second directions, L is a distance from the emitting layer to the compensation layer, ne is the first refractive index, and no is the second refractive index.

15. The display device of claim 9, wherein the compensation pattern is formed by glancing angle deposition.

16. The display device of claim 9, wherein the compensation layer comprises a material selected from a group consisting of silicon-based oxide ($SiO_x$), silicon oxynitride (SiON), and silicon-based nitride (SiON or $SiN_x$).

* * * * *